United States Patent [19]

Tabei

[11] Patent Number: 4,847,692
[45] Date of Patent: Jul. 11, 1989

[54] SOLID-STATE IMAGE PICKUP DEVICE WITH CCDS IN AN INTERLINE TRANSFER SYSTEM AND IMPROVED CHARGE TRANSFER ELECTRODE STRUCTURE

[75] Inventor: Masatoshi Tabei, Kanagawa, Japan

[73] Assignee: Fuji Photo Film Co., Ltd., Kanagawa, Japan

[21] Appl. No.: 148,539

[22] Filed: Jan. 26, 1988

[30] Foreign Application Priority Data

Jan. 26, 1987 [JP] Japan .................................. 62-14248
Jan. 26, 1987 [JP] Japan .................................. 62-14249
Jan. 26, 1987 [JP] Japan .................................. 62-14250

[51] Int. Cl.$^4$ .............................................. H04N 3/14
[52] U.S. Cl. ................................. 358/213.11; 357/24
[58] Field of Search ....................... 358/213.11, 212; 357/24 LR, 30 G, 30 H

[56] References Cited

U.S. PATENT DOCUMENTS

| 4,336,556 | 6/1982 | Sekine et al. | 357/24 LR |
| 4,514,766 | 4/1985 | Koike et al. | 358/212 |
| 4,577,233 | 3/1986 | Kimata | 358/212 |
| 4,638,362 | 1/1987 | Oshima et al. | 357/24 LR |
| 4,652,925 | 3/1987 | Imata | 357/24 LR |
| 4,774,586 | 9/1988 | Koike et al. | 357/24 LR |

Primary Examiner—Jin F. Ng
Assistant Examiner—Stephen Brinich
Attorney, Agent, or Firm—Sughrue, Mion, Zinn, Macpeak & Seas

[57] ABSTRACT

A solid-state image pickup device with charge coupled devices in an interline transfer system has an improved charge transfer electrode structure. Charge transfer electrodes do not overlap, but rather are separated from adjacent charge transfer electrodes by an extremely small distance, preferably about 0.2 μm. Processes for forming such an improved solid-state image pickup device are also disclosed.

6 Claims, 19 Drawing Sheets

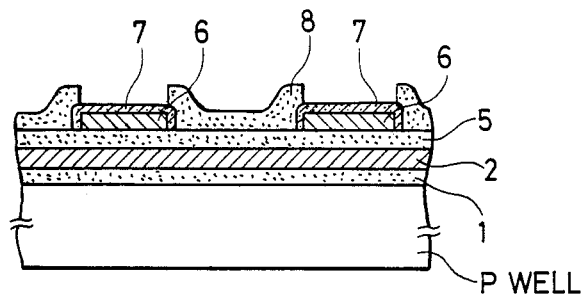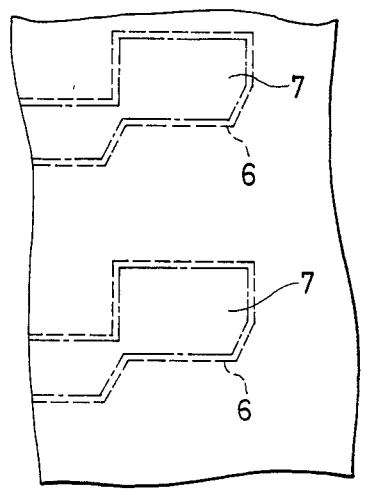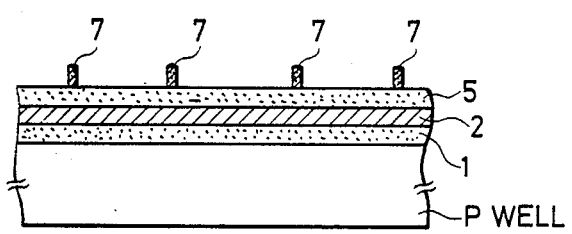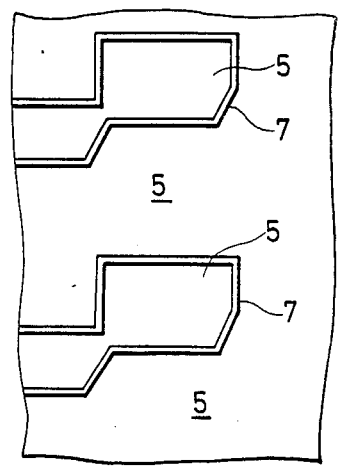

SOLID-STATE IMAGE PICKUP DEVICE WITH CCDS IN AN INTERLINE TRANSFER SYSTEM AND IMPROVED CHARGE TRANSFER ELECTRODE STRUCTURE

BACKGROUND OF THE INVENTION

1. Field of the Invention

This invention relates to a solid-state image pickup device comprising a charge coupled device (CCD) in the interline transfer system, and more particularly to a solid-state image pickup device in which the structure of a transfer electrode is improved, and a manufacturing method thereof.

2. Prior Art

FIG. 1 shows a top view of a conventional solid-state image pickup device comprising a charge coupled device in the interline transfer system. Particularly, FIG. 1 shows diagrammatically a part of a photosensing portion of the device, in which a p-type impurity layer (p-well) formed on the surface of a semiconductor substrate is provided with plural n-type impurity layers in a matrix formed to form plural photo-diodes $Pd_{11}$ ..., $Pd_{1n}$, $Pd_{21}$, ..., $Pd_{2n}$, $Pd_{31}$, ..., $Pd_{3n}$, and so on in the p-type impurity layer. Plural charge channels $L_1$, $L_2$, $L_3$ and so on (hereinafter referred to as "$L_j$" (j=1, ..., n)) for transferring signal charges in the vertical direction are formed between the adjacent columns of photodiodes.

The hatched portion of FIG. 1 encircled with a dotted line, except for each photo-diode $Pd_{ij}$ and each charge transfer channel $L_j$, illustrates a channel stopper (isolation).

Plural transfer electrodes $G_1$, $G_2$, $G_3$ and so on (hereinafter referred to as "$G_i$ (i=1−m), each comprising a polysilicon layer extending horizontally, are placed in juxtaposition with each other on the charge transfer channel. The respective adjacent four electrodes of the transfer electrodes are provided with transfer clock signals $\phi 1$, $\phi 2$, $\phi 3$ and $\phi 4$ to be actuated by a four-phase driving system. That is, two adjacent electrodes (for example, $G_1$ and $G_2$), each partly overlapping the other, are assigned to the photo-diodes (for example, $Pd_{11}$, $Pd_{12}$, ..., $Pd_{1n}$) arranged in a row. Such partial overlap between the two adjacent electrodes prevent the occurrence of a potential barrier between the transfer electrodes and cause the charge transfer channels $L_3$ to stably transfer signal charges, which are produced in photodiodes $Pd_{ij}$ and outputted through the transfer gates $Tg_{11}$, $Tg_{12}$, ..., $T_{gmn}$ to the corresponding charge transfer channels $L_j$.

The conventional solid-state image pickup device as described above has a disadvantage that a steep step portion formed at the overlapped portion of the respective adjacent transfer electrodes (e.g., a portion indicated by EJ shown in FIG. 2) is liable to be damaged, resulting in the degradation of the voltage-resistance of the transfer electrodes and decrease of yield of products, and further has another disadvantage that it is difficult to improve the degree of integration of the device in the direction of charge transfer because the overlapped portions as described above are required.

SUMMARY OF THE INVENTION

An object of this invention is to provide a solid-state image pickup device including transfer electrodes having the novel structure of not having overlapped portions, and a process for producing the device.

A solid-state image pickup device according to one aspect of this invention comprises plural photosensing elements, charge transfer channels formed between the photosensing elements and extending in he charge transfer direction, plural transfer electrodes juxtaposed with each other on the charge transfer channels in the charge transfer direction and supplied with clock signals, isolations for electrically separating the photosensing elements from each other and the charge transfer channels from each other, and metal wires formed on the transfer electrodes along the charge transfer channels for transmitting the clock signals to be applied to the transfer electrodes, wherein each of the transfer electrodes comprises a pair of end portions covering a pair of the charge transfer channels located at both sides of each of the photosensing elements, and a middle portion covering each of the isolations and connected to the pair of end portions, and wherein the middle portion is provided with a contact for electrically connecting the middle portion to each of the metal wires, and a process for producing the above device comprising the steps of:

(1) laminating a first polysilicon layer and nitride layer in that order on said charge transfer channels in a semiconductor substrate and forming on the nitride layer a second polysilicon layer having the shape corresponding to that of said transfer electrodes to be formed;

(2) forming a poly-oxide layer on the surface of the second polysilicon layer;

(3) exposing the top side of the poly-oxide layer and coating other surfaces with a photoresist layer;

(4) eliminating the top side of said poly-oxide layer and the second polysilicon layer using an etching treatment to leave the side walls of the poly-oxide layer on the surface of the nitride layer;

(5) eliminating the nitride layer, except for the portion coated with the side walls of the poly-oxide layer, using an anisotrophy etching treatment;

(6) forming a silicon oxide layer on the surface of said first polysilicon layer except for the portion coated with the remaining nitride layer;

(7) eliminating the remaining nitride layer and the poly-oxide layer using the etching treatment to expose a portion of the first polysilicon layer coated with the nitride layer; and (8) eliminating the exposed portion of the polysilicon layer using the anisotropy etching treatment to divide the first polysilicon layer into plural separate transfer electrodes.

A solid-state image pickup device according to a second aspect of this invention comprises plural photosensing elements, charge transfer channels formed between the photosensing elements and extending in the charge transfer direction and isolations for electrically separating the photosensing elements from each other and the charge transfer channels from each other, plural first transfer electrodes juxtaposed with each other on the charge transfer channels in the charge transfer direction, plural second transfer electrodes formed between the adjacent first transfer electrodes and extending vertically in the charge transfer direction on the isolations for electrically separating the photosensing elements from each other, and metal wires, at least respective two wires being paired and extended along each of said charge transfer channels on the first and second transfer electrodes, wherein the first transfer electrodes and the metal wires are connected through contacts to each other and wherein the second transfer electrodes and the metal wires are supplied with clock signals, and a process for producing the above device comprises the steps of:

(1) laminating on the charge transfer channels formed in a semiconductor substrate a silicon oxide layer, a first polysilicon layer and a nitride layer, in that order, and forming on the nitride layer a second polysilicon layer having the shape corresponding to that of each of the transfer electrodes to be formed;

(2) forming a poly-oxide layer on the surface of the second polysilicon layer;

(3) exposing the top side of the poly-oxide layer and coating other surfaces with a photoresist layer;

(4) eliminating the top side of said poly-oxide layer and the second polysilicon layer using an etching treatment to leave the side walls of the poly-oxide layer on the surface of the nitride layer;

(5) eliminating the nitride layer, except for the portion coated with the side walls of the poly-oxide layer, using an anisotropy etching treatment;

(6) forming a silicon oxide layer on the surface of the first polysilicon layer except for the portion coated with the remaining nitride layer;

(7) eliminating the remaining nitride layer and the poly-oxide layer using said etching treatment to expose the portion of the first polysilicon layer coated with the remaining nitride layer;

(8) eliminating the exposed first polysilicon layer using the anisotropy etching treatment to divide the first polysilicon layer into plural separate transfer electrodes.

A solid-state image pickup device according to a third aspect of this invention comprises plural photosensing elements, charge transfer channels formed between the photosensing elements and extending in the charge transfer direction, plural transfer electrodes juxtaposed with each other along the charge transfer direction on the charge transfer channels and supplied with clock signals, and isolations for electrically separating the photosensing elements from each other and the charge transfer channels from each other, first metal wires formed in the charge transfer channels on the transfer electrodes and second metal wires formed on the isolations for electrically separating the photosensing elements from each other, each of the second metal wires intersecting the first metal wires and electrically separated, through an insulation layer, from each of the first metal wires, wherein one end of each of the transfer electrodes is formed on each of the charge transfer channels, and the other end is formed on each of the isolations for electrically separating the photosensing elements from each other, the other end formed on each of the isolations being connected through each of contacts to each of the first or second metal wires, and wherein the clock signals are applied to the transfer electrodes through the first and second metal wires and the contacts, and a process for producing the above device comprises the steps of:

(1) laminating on the charge transfer channels formed in a semiconductor substrate a silicon oxide layer, a first polysilicon layer and a nitride layer in that order, and forming on the nitride layer a second polysilicon layer having the shape corresponding to that of each of the transfer electrodes to be formed;

(2) forming a poly-oxide layer on the surface of the second polysilicon layer;

(3) exposing the top side of the poly-oxide layer and coating other surfaces with the photoresist layer;

(4) eliminating the top side of the poly-oxide layer and the second polysilicon layer using an etching treatment to leave side walls of the poly-oxide layer on the surface of the nitride layer;

(5) eliminating the nitride layer, except for the portion coated with the side walls of the poly-oxide layer;

(6) forming a silicon oxide layer on the surface of the first polysilicon layer, except for the portion coated with the remaining nitride layer;

(7) eliminating the remaining nitride layer and the poly-oxide layer using the etching treatment to expose a portion of the first polysilicon layer coated with the nitride layer; and (8) eliminating the exposed first polysilicon layer using an anisotropy etching treatment to divide the second polysilicon layer into plural separate transfer electrodes.

BRIEF DESCRIPTION OF THE DRAWINGS

FIGS. 6–13 are top views and cross-sectional views of the device as shown in FIG. 3 in correspondence with the cross-sectional view as shown in FIG. 5 for explaining the manufacturing process of the device as shown in FIG. 3;

DETAILED DESCRIPTION OF THE INVENTION

The preferred embodiments will be described hereinunder in detail with reference to the accompanying drawings.

Figure 3:
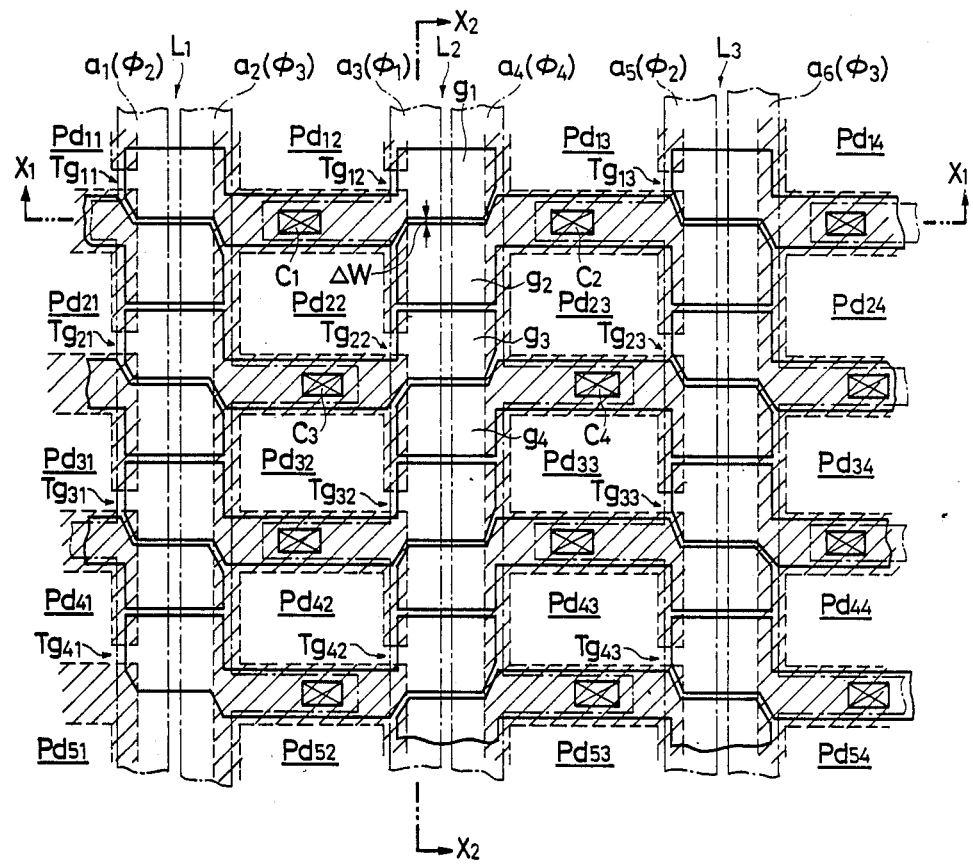
FIG. 3 is a top view showing a solid-state image pickup device of a first embodiment according to this invention.

FIG. 3 is a top view showing a first embodiment of a photosensing portion of the device according to this invention. Like the conventional device shown in FIG. 1, the photosensing portion includes plural photodiodes $Pd_{ij}$ ($i=1-m$, $j=1-n$) comprising a p-well and plural n-type impurity layers in the matrix-form provided within the p-well, plural charge transfer channels, $L_j$ |($j=1-n$) for vertically transferring signal charges, the charge transfer channels being provided between the respective adjacent columns of photodiodes; isolations formed at the hatched portion enclosed by a dotted line as shown in FIG. 3; and transfer gates $Tg_{ij}$ ($i=1-m$, $j=1-n$) for transferring signal charge produced in each photodiode $Pd_{ij}$ to the corresponding charge transfer channel, $L_j$.

Figure 1:
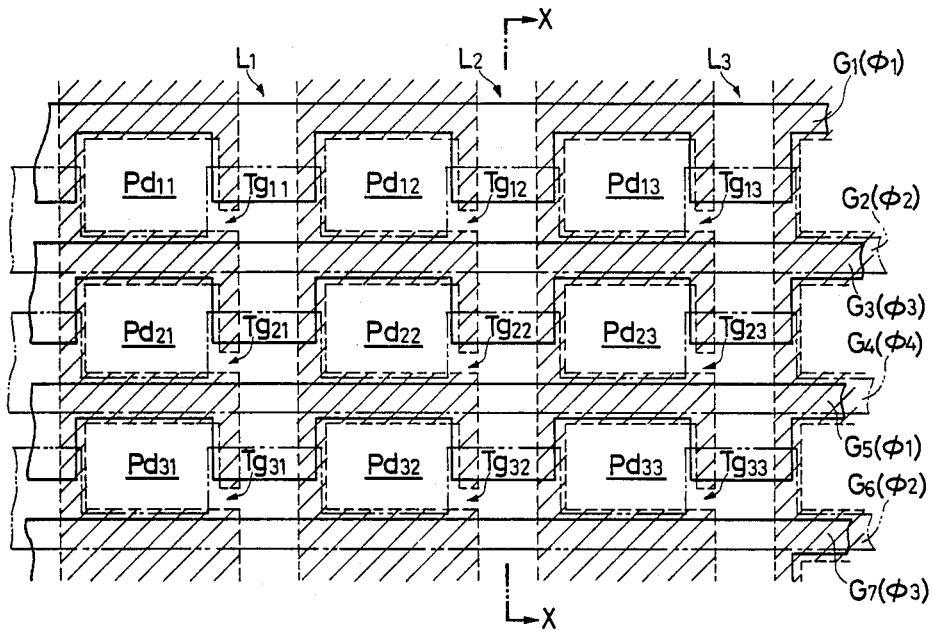
FIG. 1 is a top view showing a conventional solid-state image pickup device.
Figure 2:
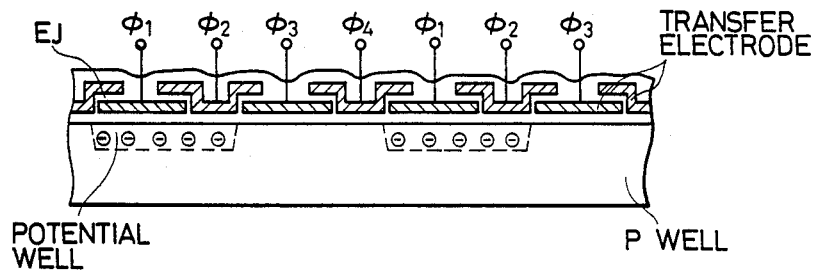
FIG. 2 is a cross-sectional view taken along the line x—x of the device as shown in FIG. 1.

A device according to this invention differs from the conventional device, as shown in FIG. 1, in the structure of transfer electrodes. The transfer electrodes according to this invention comprise polysilicon layers and are arranged in the U-shaped form as shown in FIG. 3. Above the transfer electrodes, plural metal wires $a_1, a_2, \ldots, a_{2n}$ are provided so as to vertically extend along the charge transfer channels $L_1, L_2, \ldots, L_n$. Respective two wires of the metal wires $a_1, a_2, \ldots, a_{2n}$, are paired and arranged on each charge transfer channel $L_1-L_n$. Further, the respective adjacent four wires (for example, $a_1-a_4$) are grouped and provided with clock signals $\phi 1$, $\phi 2$, $\phi 3$ and $\phi 4$ to actuate the device by means of a four-phase driving method. The transfer electrodes are orderly arranged in the same pattern as the photodiodes, and therefore the transfer electrodes g1, g2, g3 and g4 will be representatively described hereinafter.

One and the other ends of the transfer electrode g1 are located above the charge transfer channels $L_1$ and $L_2$, respectively, the body thereof being located above an isolation which separates the photodiodes $Pd_{12}$ and $Pd_{22}$ from each other. One and the other ends of the transfer electrode g2 are located above the charge transfer channels $L_2$ and $L_3$, the body thereof being located at an isolation for separating the photodiodes $Pd_{13}$ and $Pd_{23}$ from each other. Furthermore, the transfer electrodes g3 and g4 are located between the photodiodes $Pd_{22}$ and $Pd_{32}$ and between the photodiodes $Pd_{23}$ and $Pd_{33}$, respectively. The respective ends of the transfer electrodes g1—g4 formed above the charge transfer channel $L_2$ are electrically separated at an extremely short interval $\Delta W$ (approximately 0.2 $\mu$m). The transfer electrodes g1, g2, g3 and g4 are electrically connected through contacts $C_1$, $C_2$, $C_3$, and $C_4$ to the metal wires $a_3$, $a_5$, $a_2$ and $a_4$, respectively. Other transfer electrodes are electrically connected to the metal wires in the same manner as described above, and provided with the clock signals $\phi 1-\phi 4$, so that potential wells are formed in the respective charge transfer channels $L_j$ to transfer signal charges.

Figure 4:
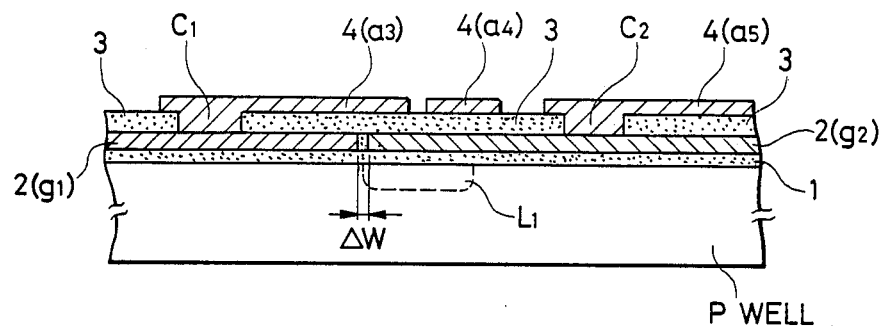
FIGS. 4 and 5 are cross-sectional views taken along the lines $x_1$—$x_1$ and $x_2$—$x_2$, respectively, of the device shown in FIG. 3.
Figure 5:
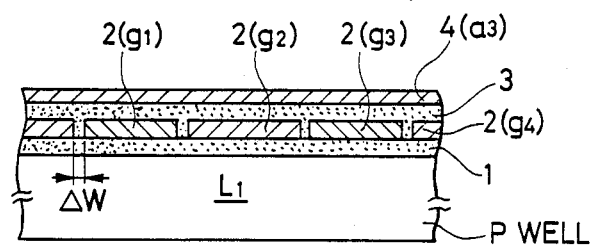

FIGS. 4 and 5 are cross-sectional views taken along lines $X_1-X_1$ and $X_2-X_2$ of the device shown in FIG. 3. There is shown in FIGS. 4 and 5 the lamination structure of the device. That is, the charge transfer channel $L_1$ formed in a p-well is coated with a silicon oxide ($SiO_2$) film 1 on the surface thereof, and a polysilicon layer 2 constituting the transfer electrodes g1, g2 and so on is formed on the surface of the film 1. The polysilicon layer 2 is coated with a silicon oxide ($SiO_2$) film 3 which has throughholes for partially connecting the polysilicon layer 2 through the contacts $C_1$, $C_2$ and so on to an aluminum wire layer 4 constituting the metal wires $a_3$, $a_4$, $a_5$ and so on. In the structure as described above, the adjacent transfer electrodes are separated at an extremely short interval $\Delta W$ (0.2 $\mu$m), so that no potential barrier occurs between the transfer electrodes, and signal charges are stably transferred.

A process for producing the solid-state image pickup device having the structure as described above will now be described with reference to FIGS. 6-13.

Figure 6A:
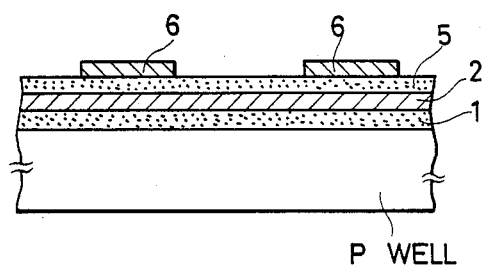
Figure 6B:
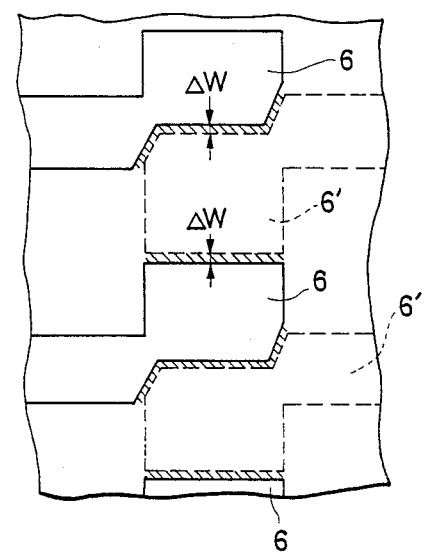

The cross-sectional structure as shown in FIGS. 6-13 corresponds to that shown in FIG. 5. FIGS. 6($b$), 8($b$) and 9($b$) are top views of the device as shown in FIG. 5. At the first step, as shown in FIG. 6($a$) and 6($b$), a p-well, with n-type impurity layers for forming photodiodes, and isolations are formed on the surface side of a semiconductor substrate, and then a silicon oxide film 1, a first polysilicon layer 2 and a nitride layer ($Si_3N_4$) 5 are formed in that order. The layers 2 and 5 are formed so as to cover the whole photosensing portion. The transfer electrodes $g_1$ ($i=1-m$) are formed by subjecting the polysilicon layer 2 to treatments as described hereinafter.

Further, a second polysilicon layer 6 having the substantially same shape as each transfer electrode is formed on the surface of the nitride layer 5. In this case, each polysilicon layer 6 is formed so as to fit its shape to the shape of each of the transfer electrodes which is disposed every other transfer electrode, for example, g1, g3, g5 and so on, and the corresponding polysilicon layers to the other transfer electrodes, for example, g2, g4, g6 and so on are left as opening portions 6' enclosed by a dotted line in FIG. 6(b). As it is a most important feature of this embodiment to juxtapose the transfer electrodes on the charge transfer channels at an extremely short interval $\Delta W$, the portions between the polysilicon layers 6 and the opening portions 6' are beforehand designed with sufficient accuracy.

Figure 7:
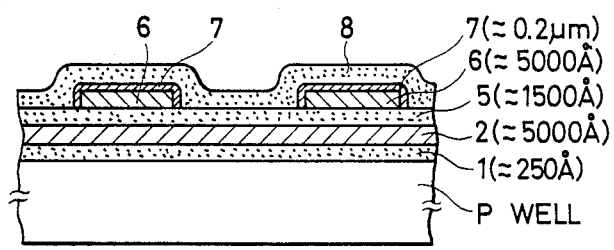

At the second step as shown in FIG. 7, a poly-oxide layer 7 is formed on the surface of the second polysilicon layer 6 by means of CVD (chemical vapor deposition) or the like, and then a photoresist layer 8 is formed on the nitride 5 and the poly-oxide layer 7 as shown in FIG. 7. As an example of the structure as described above, there has been designed a device comprising a silicon oxide layer 1 of 250 Å, a first polysilicon layer 2 of 5000 Å and a polysilicon layer 7 of 0.2 $\mu$m, in thickness.

At a third step as shown in FIGS. 8($a$) and 8($b$), the photoresist layer 8 is subjected to an etching treatment to eliminate the portions corresponding to the width of the second polysilicon layer 6, so that the top sides of the poly-oxide layers 7 are exposed.

At the fourth step as shown in FIGS. 9($a$) and 9($b$), the top sides of the poly-oxide layer 7 are eliminated and then the polysilicon layer 6 is eliminated by means of the etching treatment to expose the nitride layer 5, so that both sides of the poly-oxide layer 7 having 0.2 $\mu$m of width remain on the nitride oxide layer 5.

Figure 10:
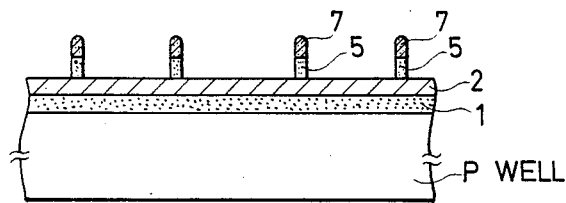

At the fifth step as shown in FIG. 10, an exposed portion of the nitride layer 5 is eliminated by means of a anisotropy etching treatment with a mixed gas comprising a gas of $CF_4$ and an oxide gas of about 10%, so that the nitride layer 5 having 0.2 $\mu$m width remains beneath the poly-oxide layer 7.

Figure 11:
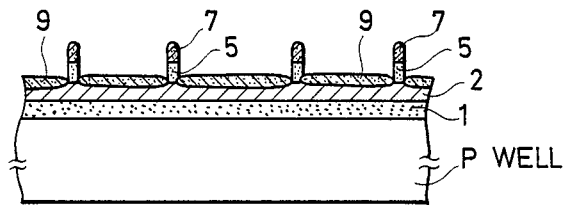

At the sixth step as shown in FIG. 11, a polysilicon oxide ($SiO_2$) layer 9 is formed on the surface of the first polysilicon layer 2 by means of a wet oxidation or the like. At this time, no silicon oxide layer 9 is formed on the portion coated with the nitride layer 5.

Figure 12:
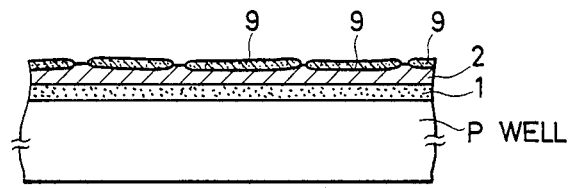

At the seventh step as shown in FIG. 12, the nitride and poly-oxide layers 5 and 7 are eliminated by means of the etching treatment. At this time, the surface of the silicon oxide layer 9 is partly etched, but most of the surface remains as shown in FIG. 12, so that the portion of the first polysilicon layer which is not coated with silicon oxide layer 9 is exposed.

Figure 13:
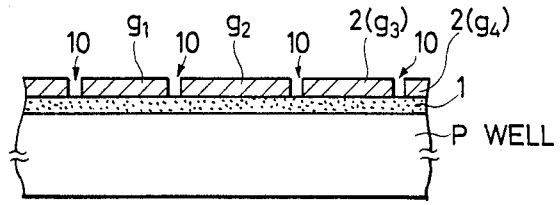

At the eighth step as shown in FIG. 13, exposed portions of the first polysilicon layer 2 are eliminated by means of the anisotropy etching treatment to form recess portions 10 having about a width ($\Delta W$) of 0.2 $\mu$m. The formation of the recess portion 10 causes the separation of the transfer electrodes g1, g2, g3 and so on from each other. After the elimination of the silicon oxide layer 9, an undesired portion which remains, for example, on the photodiodes or the like, is eliminated by the etching treatment to form a group of the transfer electrodes as shown in FIG. 3.

At the last step, the top side of the group of the transfer electrodes is coated with the silicon oxide layer, and thereafter the metal wires and the contacts as shown in FIGS. 4 and 5 are formed so that the clock signals $\phi 1$-$\phi 4$ can be applied to the transfer electrodes.

As described above, this embodiment forms transfer electrodes from a single polysilicon layer in such a manner that the transfer electrodes are separated from each other at an extremely short interval, so that unlike the conventional device, there is no overlapped portion between the transfer electrodes, and therefore the yield of the device can be improved and a high degree of integration of the device can be obtained. The metal wires $a_1, a_2, \ldots, a_{2n}$ do not intersect each other and are formed from a single layer like the transfer electrodes, so that the manufacturing process becomes simple, and the accuracy of design and the yield can be improved.

Further, the contacts for connecting a group of the metal wires with a group of transfer electrodes is provided on the isolations, so that unlike the structure in which the contacts are provided on the charge transfer channels, a stable transfer operation can be more reliably performed and the yield can be more improved.

At the first step of this embodiment as shown in FIG. 6, the polysilicon layer 6 is first formed in correspondence with the transfer electrodes $g_1, g_3, g_5$ and so on. Inversely, the polysilicon layer 6 may be first formed in correspondence with the other transfer electrodes $g_2, g_4, g_6$ and so on to form the same transfer electrodes as produced in the above process.

Figure 14:
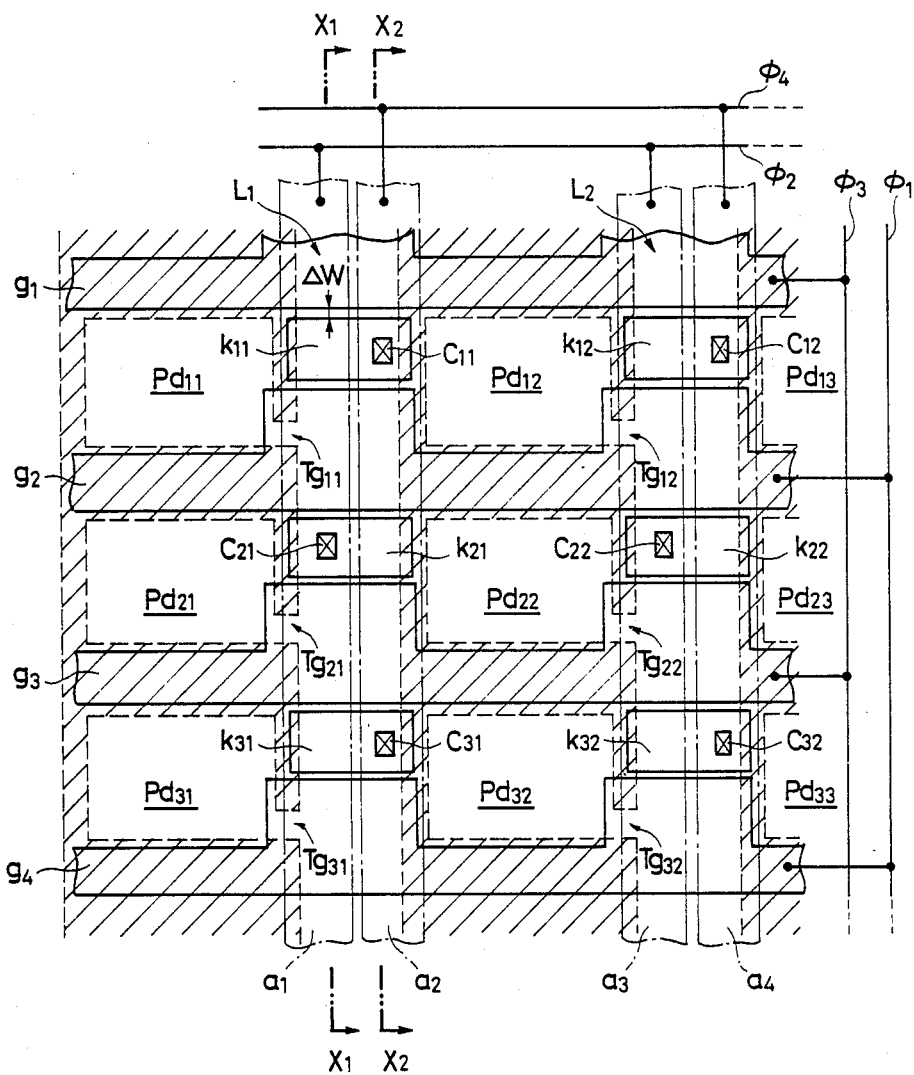
FIG. 14 is a top view of the solid-state image pickup device of a second embodiment according to this invention.

FIG. 14 is a top view showing a second embodiment of the photosensing portion according to this invention. Like the structure of the conventional photosensing portion shown in FIG. 1, plural n-type impurity layers are formed in a matrix form in a p-well to form plural photodiodes $Pd_{ij}$ (i=1—m, j=1—n), and plural charge transfer channels $L_j$ (j=1—j) for vertically transferring signal charges produced in the photodiodes are provided between the respective adjacent columns of the photodiodes. Further, isolations are designed at the hatched portion enclosed by a dotted line as shown in FIG. 14, and signal charges produced in each photodiode $Pd_{ij}$ is outputted through each transfer gate $Tg_{ij}$ (i=1—m, j 32 1—n) to each charge transfer channel.

The difference in structure between this embodiment and the conventional device as shown in FIG. 1 will now be described.

Comb-shaped second transfer electrodes $g_1, g_2, g_3, \ldots, g_m$ (hereinafter referred to as "$g_i$" (i=1—m)) extending horizontally and comprising a polysilicon layer are formed on the isolations for electrically separating the respective rows comprising the photodiodes $Pd_{11} Pd_{1n}$, $Pd_{21}$—$Pd_{2n}$, and so on from each other, and the projections of the comb-shaped transfer electrodes partially cover the top sides of the charge transfer channels $L_1, L_2, \ldots, L_n$. Unlike the conventional structure of transfer electrodes, the transfer electrodes according to this embodiment are formed on the top sides of charge transfer channels $L_1, L_2, \ldots, L_n$ in such a manner that the transfer electrodes adjacent to each other are separated at an extremely short interval W (approximately 0.2 $\mu$m).

Metal wires $a_1, a_2, \ldots, a_{2n}$ extending along the charge transfer channels $L_1, L_2, \ldots, L_n$ are formed through a silicon oxide layer ($SiO_2$) (not shown) on the transfer electrodes.

Respective adjacent two metal wires are paired and provided on each of the charge transfer electrodes $L_1$-$L_n$. One of each pair, for example, $a_1, a_3, a_5$ or the like is connected through contacts $c_{21}$—$c_{2n}$, $cm_1$-$cmn$ or the like to the transfer electrodes $k_{21}$-$k_{2n}, \ldots, k_{m1}$-$k_{mn}$ or the like. Similarly, the other of each pair, $a_2, a_4, a_6$ or the like is connected through contact members $C_{11}$-$C_{1n}, C_{31}$-$C_{3n}$ or th elike to the transfer electrodes $k_{11}$-$k_{in}, k_{31}$-$k_{3n}$ or the like. Clock signals $\phi 1$ and $\phi 3$ are applied to the comb-shaped transfer electrodes $g_i$ (i =1-m) extending horizontally, by means of a four-phase driving method and clock signals $\phi 2$ and 100 4 are applied through the metal wires $a_1$-$a_{2n}$ to the transfer electrodes $k_{11}$-$k_{1n}, \ldots$, km1-kmn, whereby potential wells are formed in the charge transfer channels $L_1 L_n$ to transfer signal charge.

Figure 15:
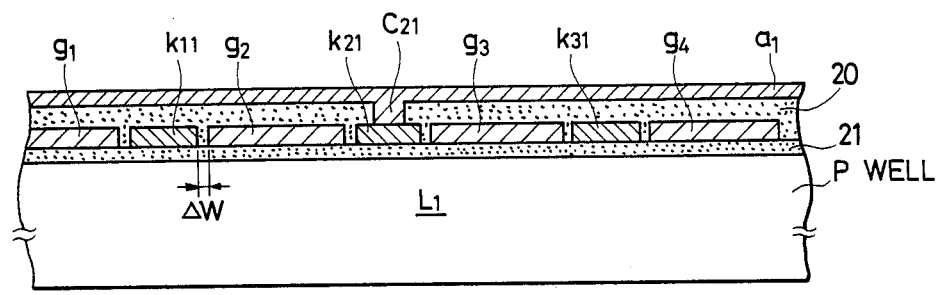
FIGS. 15 and 16 are cross-sectional views taken along the lines $x_1$—$x_1$ and $x_2$—$x_2$, respectively, of the device as shown in FIG. 14.
Figure 16:
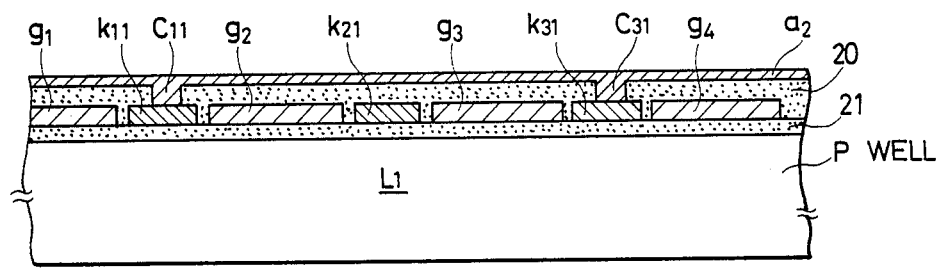

FIGS. 15 and 16 are cross-sectional views taken along lines $x_1$—$x_1$ and $x_2$—$x_2$ of the device as shown in FIG. 14.

In FIGS. 15 and 16, the surface of the charge transfer channel $L_1$ formed in the p-well of the semiconductor substrate is coated with a silicon oxide ($SiO_2$) layer 21 and the transfer electrodes $g_1, g_2, g_3$ and so on comprising a polysilicon layer are formed on the surface of the silicon oxide layer 21. Further, the transfer electrodes are coated with a silicon oxide layer ($SiO_2$) 20 as shown in FIGS. 15 and 16. The silicon oxide layer 20 has throughholes for the contacts $C_{11}, C_{21}, C_{31}$ and so on, to thereby partially connect the transfer electrodes $k_{11}$, $k_{21}, k_{31}$, and so on to the metal wires $a_1$ and $a_2$ therethrough. The adjacent transfer electrodes are separated from each other at the extremely short interval $\Delta W$, that is, approximately 0.2 $\mu$m as described above, so that no potential barrier occurs between the adjacent transfer electrodes and signal charges can be stably transferred.

Figure 17A:
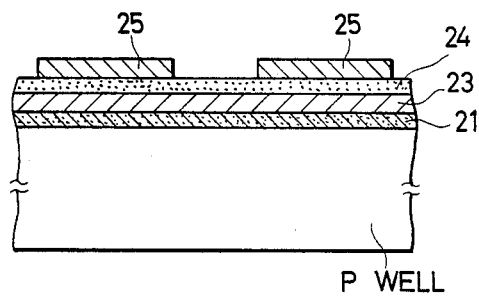
FIGS. 17–26 are top views and cross-sectional views of the device as shown in FIG. 14 in correspondence with the cross-sectional view as shown in FIG. 15 for explaining the manufacturing process of the device as shown in FIG. 14.
Figure 19A:
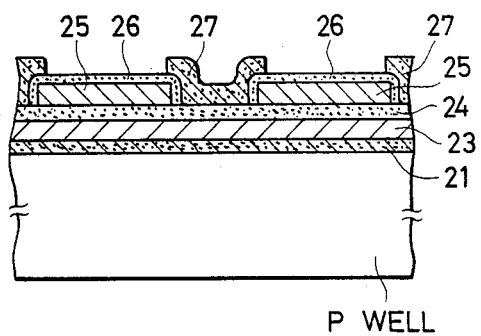
Figure 19B:
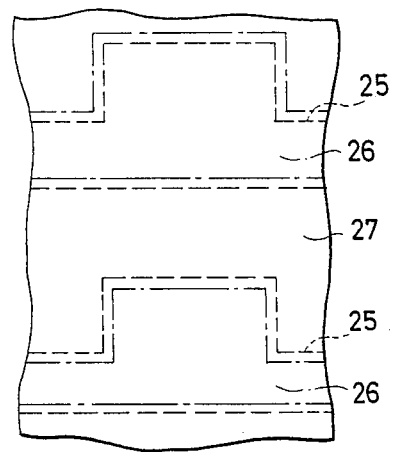
Figure 20A:
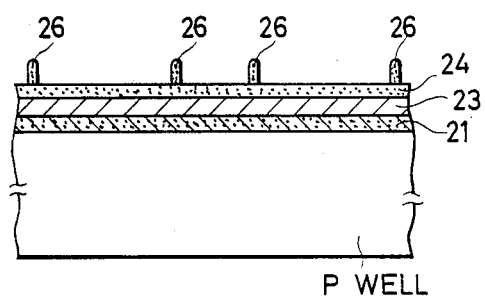
Figure 20B:
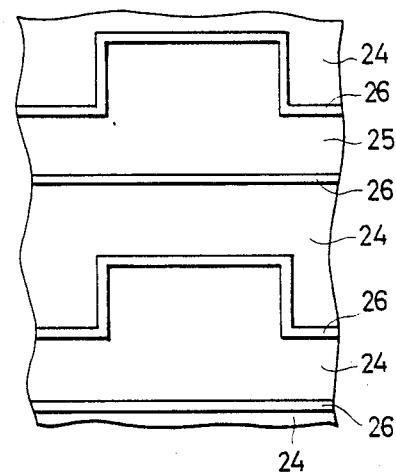

The process for producing a solid-state image pickup device having the structure as described above will be described below with reference to FIGS. 17-26. FIGS. 17(a), 19(a) and 20(a) are cross-sectional views of the manufacturing process taken along the line $x_1$—$x_1$ for the device as shown in FIG. 14 and FIGS. 17(b), 19(b) and 20(b) are top views thereof.

Figure 17B:
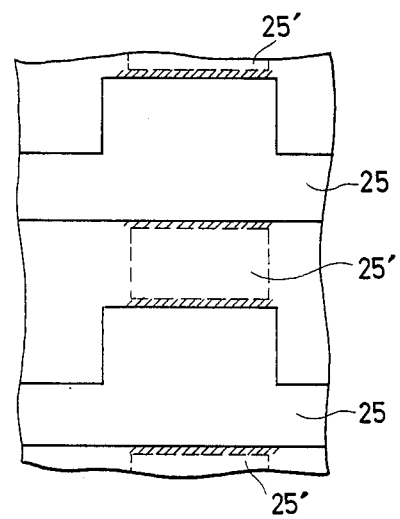

At the first step as shown in FIGS. 17(a) and 17(b), after a p-well, with n-type impurity layers for photodiodes, and isolations etc. are formed on the surface side of a semiconductor substrate, a silicon oxide layer 21, a first polysilicon layer 23 and a nitride layer ($Si_3N_4$) 24 are formed, one above the other in that order on the p-well. The layers 23 and 24 are formed so as to cover the entire photosensing portion. The transfer electrodes $g_1$ (i=1—m) are formed by subjecting the first polysilicon layer 23 to treatments as described hereinafter. Further, second polysilicon layers 25 having the substantially same shape of the comb-shaped transfer electrodes $g_1$-$g_m$ are formed on the surface of the nitride layer 24. At this time, in order to form the other transfer electrodes $k_{11}$-$k_{mn}$ later, opening (space) portions are provided between the adjacent polysilicon layers 25. Since a most important feature of this embodiment resides in that the transfer electrodes are juxtaposed with each other at an extremely short interval $\Delta W$ on the charge transfer channels, the portions (hatched portions) between the transfer electrodes 25 and the portions 25' encircled by a dotted line at which the transfer electrodes $k_{11}$-$k_{mn}$ are provided later, are beforehand designed with sufficient accuracy.

Figure 18:
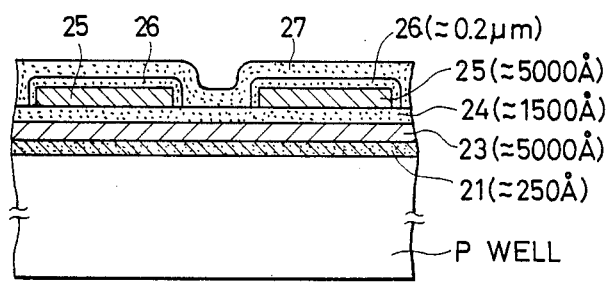

At the second step as shown in FIG. 18, a poly-oxide layer 26 is formed on the second polysilicon layer 25 by means of CVD, and further a photoresist layer is formed on the poly-oxide layer 26 and the exposed nitride layer 24. As an example of the structure as described above, there has been designed a device comprising a silicon oxide layer of 250 Å, a first polysilicon layer 25 of 5000 Å and a poly-oxide layer 26 of about 0.2 $\mu$m, in thickness.

At the third step as shown in FIGS. 19($a$) and 19($b$), the photoresist layer 27 is subjected to an etching treatment to eliminate the portion thereof corresponding to the width of the second polysilicon layer so that the top sides of the poly-oxide layers 26 are exposed.

At the fourth step as shown in FIG. 20, the top sides of the poly-oxide layers 26 are eliminated by the etching treatment, and further the second polysilicon layers 25 are eliminated by means of the etching treatment to expose the nitride layer 24 so that the projections of the poly-oxide layer 26 having about 0.2 $\mu$m of width are formed on the nitride layer 24.

Figure 21:
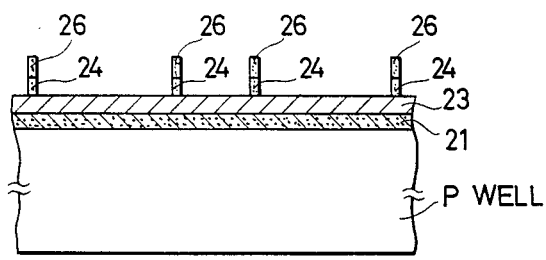

At the fifth step as shown in FIG. 21, an anisotropy etching treatment is applied to the nitride layer 24 using a mixed gas of $CF_4$ and about 10% oxide gas to eliminate the exposed portion of the nitride layer 24, whereby the nitride layer 24 having about 0.2 $\mu$m width remains beneath each of the poly-oxide layers 26.

Figure 22:
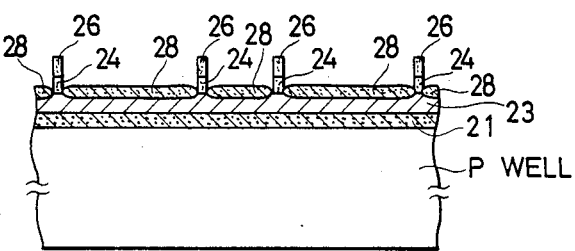

At the sixth step as shown in FIG. 22, a silicon oxide ($SiO_2$) layer 28 is formed on the surface of the first polysilicon layer 23 by means of a wet oxidation treatment. At this time, no silicon oxide layer 28 is formed on the surface of the portion coated with the nitride layer 24.

Figure 23:
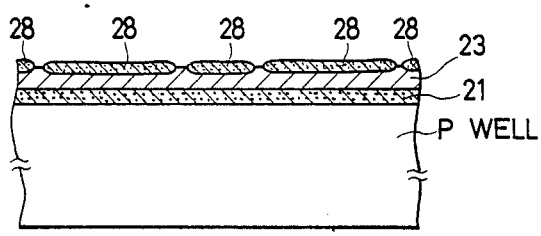

At the seventh step as shown in FIG. 23, the nitride layer 24 is eliminated by means of the etching treatment, thereafter the poly-oxide layer 26 is eliminated by a hydrofluoric acid solution. At this time, the surface of each silicon oxide layer 28 is etched a little, but are mostly kept unetched as shown in FIG. 23, so that the first polysilicon layer 23 is partially exposed.

Figure 24:
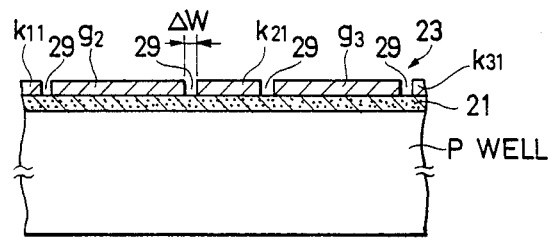

At the eighth step as shown in FIG. 24, the exposed portion of the first polysilicon layer 23 is eliminated by means of the anisotropy etching treatment to form recess portions 29 having about 0.2 $\mu$m width. The formation of the recess portions 29 performs the separation of the transfer electrodes $g_1$-$g_m$ and $k_{11}$-$k_{mn}$ from each other.

Figure 25:
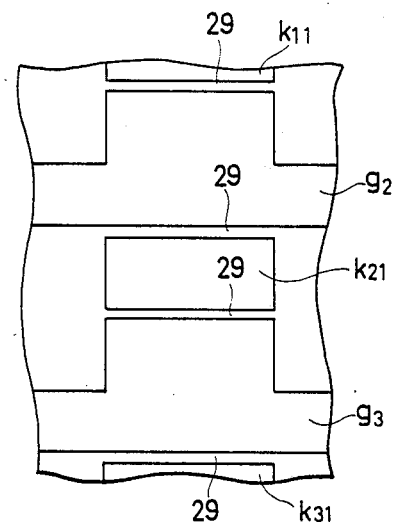

At the ninth step as shown in FIG. 25, an undesired first polysilicon layer 23 which is located on the portions except for the charge transfer channels, for example, on the photodiodes and so on, is eliminated to obtain the transfer electrodes each having the shape as shown in FIG. 14.

Figure 26:
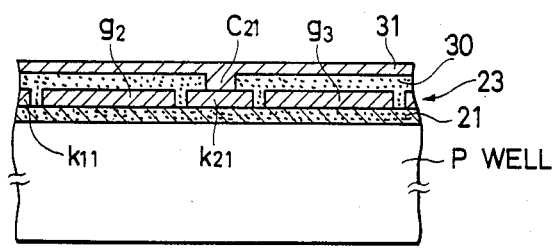

At the tenth step as shown in FIG. 26, the surface of the device produced at the ninth step is coated with a silicon oxide layer ($SiO_2$) 30 having throughholes for contacts $C_{11}$-$C_{mn}$, and thereafter metal wires $a_1$-$a_{2n}$ are formed from an aluminum layer 31.

According to this embodiment as described above, as the transfer electrodes are formed by separating a single polysilicon layer at an extremely short interval ($\Delta W$), overlapped portions between the transfer electrodes are not required, unlike the conventional device, to improve the yield and obtain a high degree of integration.

In place of the first step of this embodiment as shown in FIG. 17 in which the second polysilicon layer 25 is first formed in correspondence with the comb-shaped transfer electrodes $g_1$-$g_m$, it is possible tha the second polysilicon layer is first formed in correspondence with the rectangular transfer electrodes $k_{11}$-$k_{mn}$ and thereafter the same processes as described above are carried out.

As described above, polysilicon layers arranged on the same plane are separated at an extremely short interval to form plural transfer electrodes, so that the degree of integration can be improved. Further, unlike a conventional device, no overlapped portion is required between the transfer electrodes, resulting in the prevention of degradation of voltage-resistance and improvement of the yield. Still further, metal wires for transmitting clock signals are arranged on the same plane, so that no multilayer wiring is demanded to simplify the manufacturing process.

Figure 27:
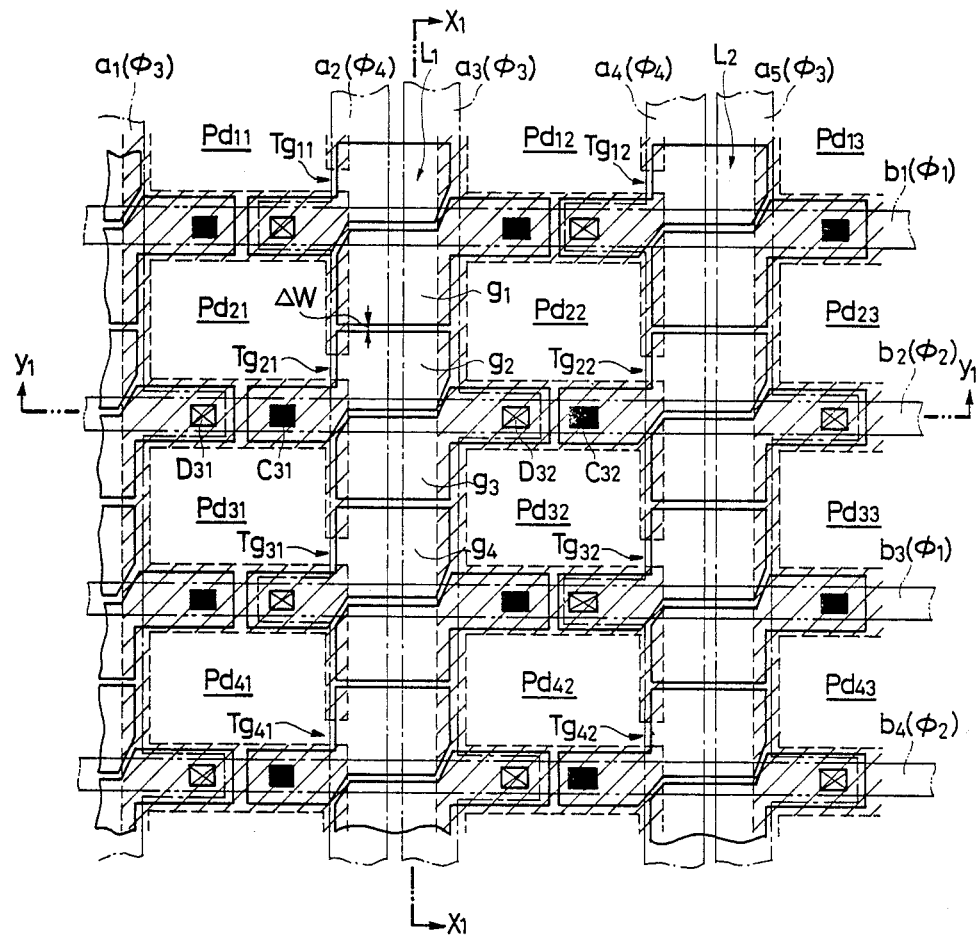
FIG. 27 is a top view of the solid-state image pickup device of a third embodiment according to this invention.

FIG. 27 is a top view showing a third embodiment of the photosensing portion according to this invention.

Like the structure of the conventional photosensing portion as shown in FIG. 1, plural n-type impurity layers are formed in a matrix in a p-well to form plural photodiodes $Pd_{ij}$ (i=1−m, j=1−n), and plural charge transfer channels $L_j$ (j =-j), for vertically transferring signal charges produced in the photodiodes, are provided between the respective adjacent columns of photodiodes. Further, isolations are provided at the hatched portion enclosed by a dotted line as shown in FIG. 27, and a signal charge produced in each photodiodes $Pd_{ij}$ is outputted through a transfer gate $Tg_{ij}$ (i=1−m, j=1−n) to each charge transfer channel.

The difference between this embodiment and the conventional device shown in FIG. 1 will now be described.

Key-shaped transfer electrodes, each comprising a polysilicon layer, are vertically juxtaposed on charge transfer channels $L_j$.

First metal wires $a_1$-$a_{2n}$ extending vertically are formed through an insulation layer comprising silicon oxide ($SiO_2$) on the transfer electrodes. Further, a group of second metal wires $b_1$-$b_m$ is horizontally formed through an insulation layer comprising silicon oxide film (not shown) on the group of the first metal wires $a_1$ $a_{2n}$. As shown in FIG. 27, the respective two metal wires of the metal wires $a_1$, $a_2$, . . . , $a_{2n}$ are paired and arranged on each of the charge transfer channels $L_1$-$L_n$, and further the second metal wires $b_1$-$b_m$ extend horizontally on the isolations. The group of charge transfer electrodes are connected through contacts (as represented by ■ and [X] in FIG. 27 and will be hereinafter described in detail) to the first and second metal wires $a_1$-$a_{2n}$ and $b_1$-$b_m$. The first metal wires $a_1$-$a_{2n}$ are supplied alternately with clock pulses $\phi 3$ and $\phi 4$, and the second metal wires $b_1$-$b_m$ are supplied alternately with clock pulses $\phi 1$ and $\phi 2$, the clock pulses being actuated by means of the four-phase driving system. As a representative of the groups of the charge transfer electrodes, the structures of the transfer electrodes $g_1$, $g_2$, $g_3$ and $g_4$ formed in the neighborhood of the photodiodes $Pd_{21}$, $Pd_{22}$, $Pd_{31}$ and $Pd_{32}$, the first metal wires $a_1$, $a_2$ and $a_3$, and the second metal wires $b_2$ and $b_3$ will be described hereinafter.

Figure 28:
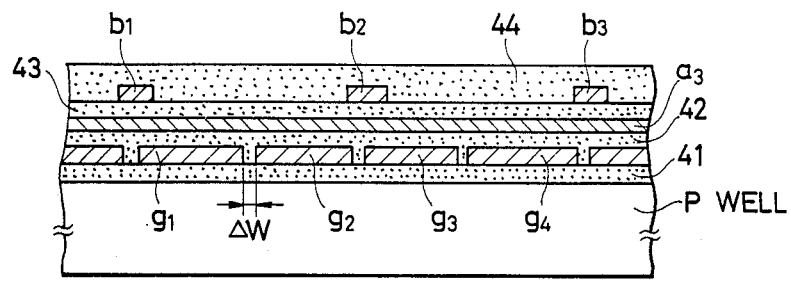
FIGS. 28 and 29 are cross-sectional views taken along the lines $x_1$—$x_1$ and $y_1$—$y_1$, respectively, of the device as shown in FIG. 27.
Figure 29:
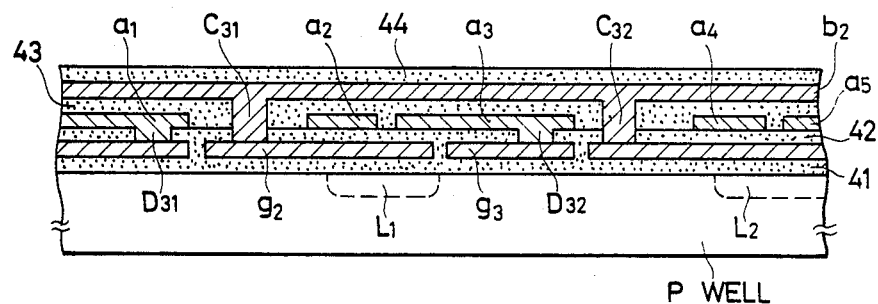

FIG. 28 is a cross-sectional view taken along a line $x_1$—$x_1$ of the device as shown in FIG. 27, and FIG. 29 is a cross-sectional view taken along line $y_1$—$y_1$ of the device as shown in FIG. 27. In FIGS. 28 and 29, the surfaces of the charge transfer channels $L_1$, $L_2$ and so on formed in the p-well of the semiconductor substrate are coated with silicon oxide ($SiO_2$) layer 41 and the transfer charge $g_1$, $g_2$, $g_3$, $g_4$ and so on each of which comprises a polysilicon layer are formed on the silicon oxide film 41. The transfer electrodes $g_1$-$g_4$, which are adjacent to each other, are separated from each other at a remarkably short interval $\Delta W$ (0.2 $\mu m$). A silicon oxide layer 42 is provided on the transfer electrodes and the spaces therebetween, and the first metal wires $a_1$, $a_2$, $a_3$, $a_4$ and so on are formed on the silicon oxide layer 42. The surfaces of the first metal wires $a_1$, $a_2$, $a_3$, $a_4$, etc. and the exposed silicon oxide film 42 are coated with a silicon oxide 43 on which the second metal wires $b_1$, $b_2$, $b_3$ and so on are formed. The first metal wires $a_1$, $a_2$, $a_3$ and so on are connected through the contacts $D_{31}$, $D_{32}$, etc. represented by the character [X] in FIG. 27 to the particular transfer electrodes $g_3$ and so on. The second metal wires $b_1$, $b_2$, etc. are connected through the contacts $C_{31}$, $C_{32}$, etc. represented by the character ■ as shown in FIG. 27 to the particular transfer electrodes $g_2$ and so on. The most top surface of the device is coated with a silicon oxide film 44.

As described above, the separation interval $\Delta W$ between the respective adjacent transfer electrodes is remarkably short, so that no potential barrier occurs between the adjacent transfer electrodes and signal charges can be stably transferred.

A process for producing the solid-state image pickup device having the structure as described above will now be described with reference to FIGS. 30–39. The cross-sectional structure as described in Figs. 30–39 corresponds to that as shown in FIG. 28.

Figure 30A:
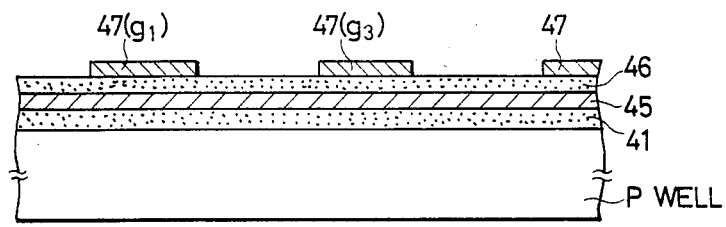
FIGS. 30–37 are top views and cross-sectional views of the device as shown in FIG. 17 in correspondence with the cross-sectional view as shown in FIG. 28.
Figure 30B:
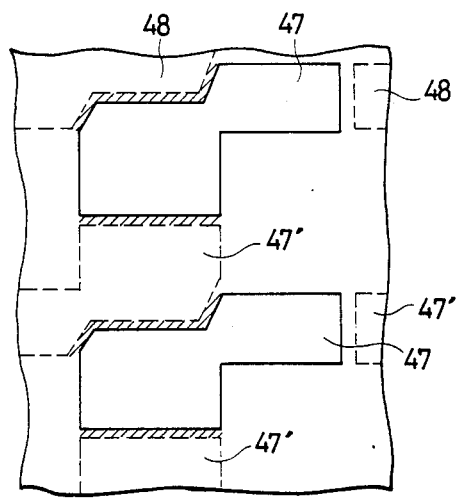

At the first step as shown in FIGS. 30(a) and 30(b), after a p-well, with n-type impurity layers for photodiodes, and isolations are formed on the surface side of a semiconductor substrate, a silicon oxide layer 41, first polysilicon layer 45 and nitride layer 46 ($SiO_3N_4$)$_6$ are laminated in that order. Transfer electrodes $g_1$, $g_2$, $g_3$ and so on are formed by subjecting the first polysilicon layer 45 to treatments as described hereinafter. Further, a second polysilicon layers 47 having the substantially same shape as the key-shaped transfer electrodes $g_1$, $g_3$ and so on is formed. Between respective adjacent polysilicon layers, there are provided opening portions where the other transfer electrodes $g_2$, $g_4$ and so on are formed afterwards.

As a most important feature of this embodiment is to juxtapose the transfer electrodes on the charge transfer channels at an extremely short interval $\Delta W$, the hatched portions located between the portions 47' for the transfer electrodes represented by a dotted line and the portions 47 for the transfer electrodes represented by a solid line are beforehand designed with a sufficient accuracy, and other portions, for example, the portions confronting the photodiodes may be suitably designed.

Figure 31:
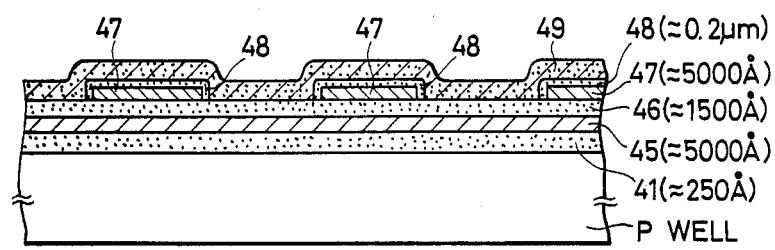

At the second step as shown in FIG. 31, poly-oxide layers 48 are formed on the surface of the second polysilicon layers 47, and further a photoresist layer 49 is coated thereon.

For example, there may be provided a device comprising a silicon oxide layer 41 of 250 Å, a first polysilicon layer 45 of 5000 Å, a nitride layer 46 of 1500 Å, a second polysilicon layer 47 of 5000 Å and a poly-oxide layer 48 of 0.2 $\mu m$ in thickness.

Figure 32A:
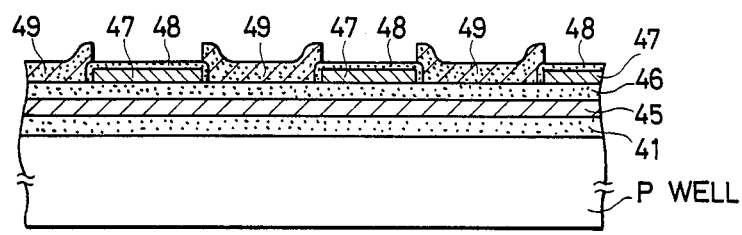
Figure 32B:
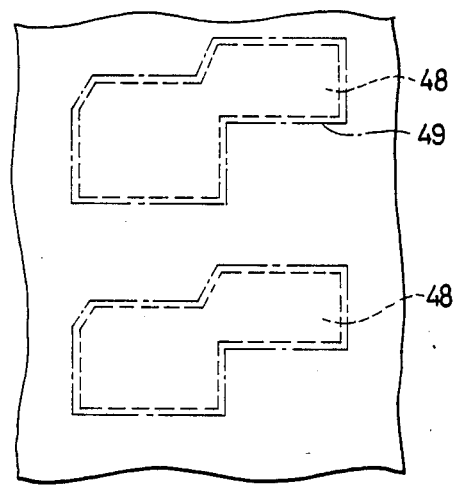

At the third step as shown in FIGS. 32(a) and 32(b), the portions of the photoresist 49 which corresponds to the width of the second polysilicon layers are eliminated by an etching treatment to expose the upsides of the poly-oxide layers 48.

Figure 33A:
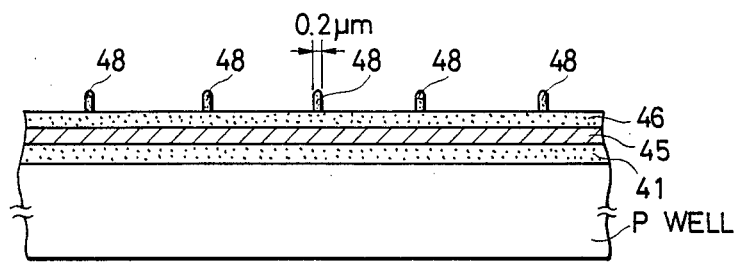
Figure 33B:
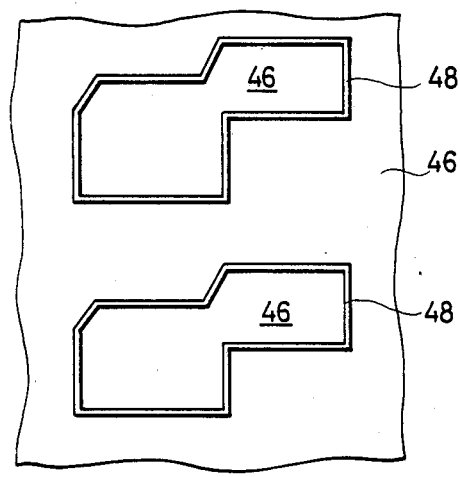

At the fourth step as shown in FIGS. 33(a) and 33(b), the top sides of the poly-oxide layers 48 are eliminated by means of the etching treatment and then the second polysilicon layer 47 is eliminated by means of the etching treatment to expose the nitride layer 46, so that the side walls for the poly-oxide layers 48 having about 0.2 $\mu m$ width remain on the nitride layer 46.

Figure 34:
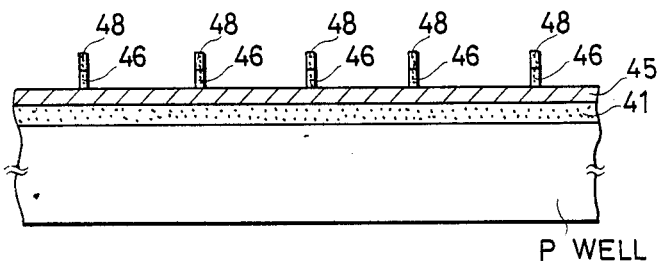

At the fifth step as shown in FIG. 34, an anisotropy etching treatment is conducted using a mixed gas comprising a gas $CF_4$ and about 10% oxide gas to eliminate the exposed portion of the nitride layer 46, so that the nitride layer 46 having about 0.2 $\mu m$ width remains beneath each of the poly-oxide layers, and the first polysilicon layer 45 is exposed at the other portions.

Figure 35:
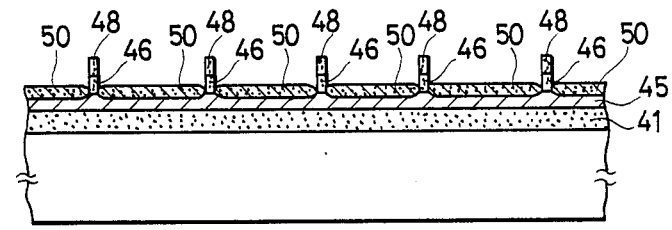

At the sixth step as shown in FIG. 35, a silicon oxide ($SiO_2$) layer 50 is formed on the surface of the first polysilicon layer 45 using wet oxidation and other treatments. At this time, no silicon layer 50 is formed at the portion coated with the nitride layer 46.

Figure 36:
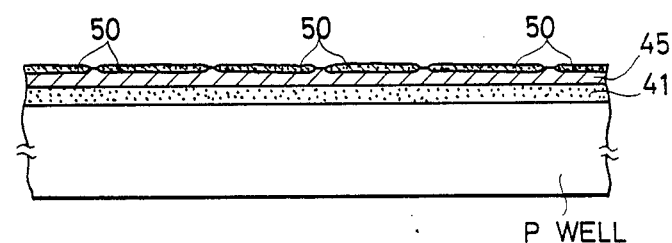

At the seventh step as shown in FIG. 36, the poly-oxide layer 48 and the nitride layer 46 are eliminated using the etching treatment. At this time, a small part of the surface of the silicon oxide layer 50 is etched, but most of the surface remains on the first polysilicon layer 45 as shown in FIG. 36, so that a portion of the first polysilicon layer 45, on which the nitride layer 46 is eliminated, is exposed.

Figure 37:
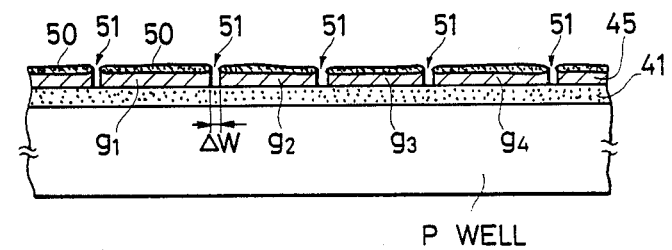

At the eighth step as shown in FIG. 37, the exposed portion of the first polysilicon layer 45 is eliminated using the anisotropy etching treatment to form recess portions 51 having 0.2 $\mu m$ width ($\Delta W$) as shown in FIG. 37. The recess portions 51 cause the transfer electrodes $g_1$-$g_4$ to be separated from each other.

At the ninth step (not shown), the silicon oxide layers 50 are eliminated using the etching treatment, and then the portions of the first polysilicon layer 45 which is not employed for the transfer electrodes, for example, an undesired portion on the photodiodes or the like is eliminated using the etching treatment to form the transfer electrodes each having the shape as shown in FIG. 27.

At the tenth step, the wiring as shown in FIGS. 29 and 30 is constructed using a conventional technique for manufacturing a metal wire comprising two layers. That is, a first aluminum layer for the first metal wires $a_1$-$a_{2n}$ is formed and then a second aluminum layer for the second metal wires $b_1$-$b_m$ is formed over the first aluminum layer. At this time, the transfer electrodes and the first and second metal wires are electrically insulated from each other through the silicon oxide layer, except for the portions on which the contacts are formed.

As described above, according to this embodiment, a single polysilicon layer is divided into plural separate parts at an extremely short interval $\Delta W$ to form the transfer electrodes. As a result, unlike a conventional device, the overlapped portion between the adjacent transfer electrodes is not needed, so that the yield can be improved and a high degree on degradation can be obtained.

In this embodiment, the second polysilicon layer 27 having the shape corresponding to the transfer electrodes $g_1$, $g_4$ and so on is first formed at the first step and then the same steps as described above are conducted, the same result can be obtained.

Other embodiments according to this invention will be described with reference to FIGS. 38 and 39.

Figure 38:
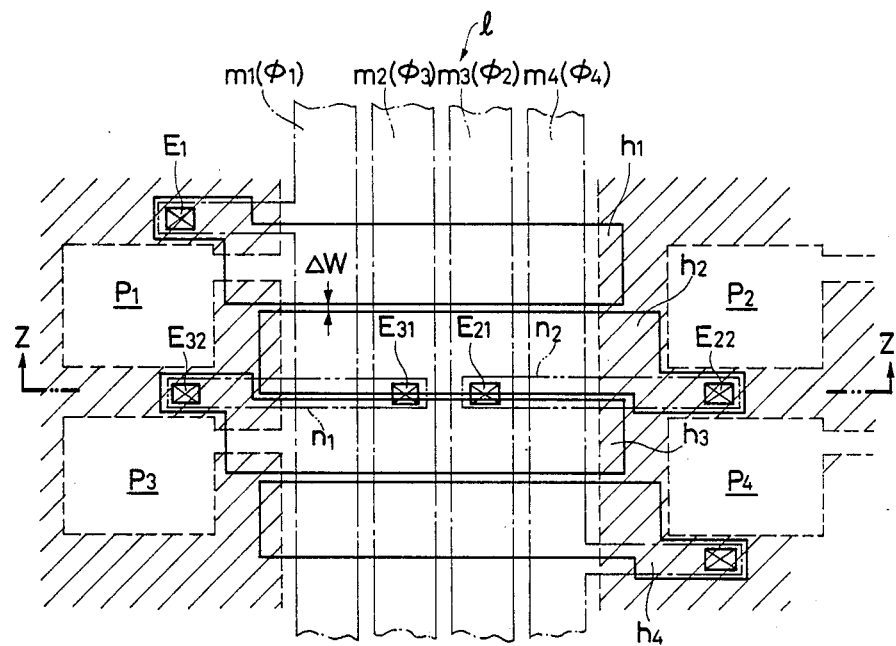
FIG. 38 is a top view of the device of fourth embodiment according to this invention.
Figure 39:
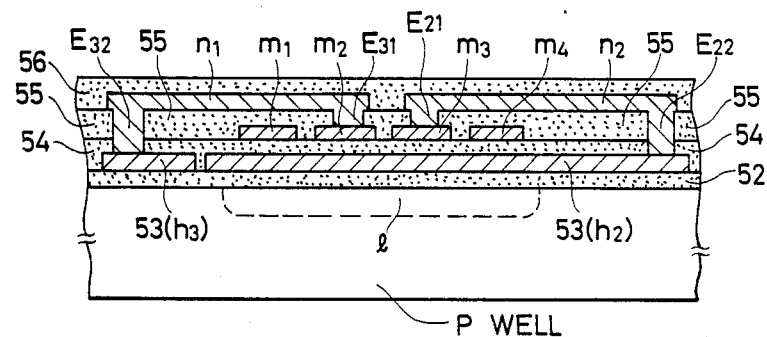
FIG. 39 is a cross-sectional view taken along the line z—z of the device as shown in FIG. 38.

FIG. 38 is a top view of the structure of transfer electrodes in a photosensing portion, and FIG. 39 is a cross-sectional view thereof. The following description is made in correspondence to the device as shown in FIG. 27. Transfer electrodes $h_1$, $h_2$, $h_3$, $h_4$ and so on are juxtaposed through a silicon oxide layer 52 on a charge transfer channel which is formed so as to be surrounded by photodiodes $p_1$-$p_4$, and coated with a silicon oxide layer 54 thereon. On the surface of the silicon oxide layer 54 are laminated four first metal wires $m_1$, $m_2$, $m_3$ and $m_4$ formed alont the charge transfer channel, a silicon oxide layer 55, and second metal wires $n_1$ and $n_2$ for connecting the first metal wires $m_2$ and $m_3$ to the transfer electrodes $h_2$ and $h_3$ in this order.

The top most surface of the device is coated with a silicon oxide layer 56. The transfer electrodes $h_1$ and $h_2$ are connected through contacts $E_1$ and $E_{22}$ to the portions extending from both ends of the metal wires, $m_1$ and $m_2$, respectively. The transfer electrode $h_2$ is connected through the contact $E_{22}$, the second metal wire $n_2$ and the contact $E_{21}$ to the first metal wire $m_3$. Further, the transfer electrode $h_3$ is connected through contact $E_{32}$, the second metal wire $n_1$ and the contact $E_{31}$ to the first metal wire $m_2$. The transfer electrodes $h_1$, $h_2$, $h_3$, $h_4$ and so on are separated from each other at an extremely short interval $\Delta W$. The first metal wires $m_1$-$m_4$ receive clock signals $\phi_1$, $\phi_2$, $\phi_3$ and $\phi_4$ which are actuated by means of a four-phase driving system.

Transfer electrodes on other charge transfer channels are designed in the same manner as described above. A device as described above is manufactured with the same steps as shown in FIGS. 30-37. Accordingly, the cross-section of the device has the structure in which there are laminated in the following order on the silicon oxide layer 52 covering the surface of the semiconductor substrate, the transfer electrodes comprising the first polysilicon layer 53, the insulation layer comprising the silicon oxide layer 54, the first metal wires $m_1$-$m_4$, the insulation layer comprising the silicon layer 55, and the second metal wires $n_1$, $n_2$ and so on, the respective metal wires and the transfer electrodes being electrically connected to each other through the contacts $E_{21}$, $E_{22}$, $E_{31}$, $E_{32}$ and so on.

According to this embodiment, similar to the first, second and third embodiments as described above, the adjacent transfer electrodes are also separated from each other at an extremely short interval so that the yield and the degree of integration can be improved.

What is claimed is:

1. A solid-state image pickup device comprising, plural photosensing elements, charge transfer channels formed between said photosensing elements and extending in the charge transfer direction, plural transfer electrodes juxtaposed on said charge transfer channels in the charge transfer direction and supplied with clock signals, isolations for electrically separating said photosensing elements from each other and said charge transfer channels from each other, the improvement comprising:

metal wires formed on said transfer electrodes along said charge transfer channels for transmitting said clock signals to be applied to said transfer electrodes;

wherein each of said transfer electrodes comprising a pair of end portions covering a pair of said charge transfer channels located at both sides of one of said photosensing elements, and a middle portion covering each of said isolation electrically separating photosensing elements from each other and connected to said pair of end portions;

wherein said middle portion is provided with a contact for electrically connecting said middle portion to each of said metal wires; and wherein there is no overlap of any transfer electrode with any other transfer electrode.

2. A solid-state image pickup device as claimed in claim 1, wherein respective two metal wires of said metal wires are paired and vertically extended on each of said charge transfer channels.

3. A solid-state image pickup device comprising, plural photosensing elements, charge transfer channels formed between the photosensing elements and extending in the charge transfer direction and isolations for electrically separating said photosensing elements from each other and said charge transfer channels from each other, the improvement comprising:

plural first transfer electrodes juxtaposed on said charge transfer channels in the charge transfer direction, plural second transfer electrodes formed between the adjacent first transfer electrodes and extending vertically in said charge transfer direction on said isolations for electrically separating said photosensing elements from each other, and metal wires, at least respective two of said metal wires being paired and extended along each of said charge transfer channels on said first and second transfer electrodes, wherein said first transfer electrodes and said metal wires are connected through contacts to each other and wherein said second transfer electrodes and said metal wires are supplied with clock signals.

4. A solid-state image pickup device comprising, plural photosensing elements, charge transfer channels formed between said photosensing elements and extending in the charge transfer direction, plural transfer electrodes juxtaposed along said charge transfer direction on said charge transfer channels and supplied with clock signals, and isolation for electrically separating said photosensing element from each other and said charge transfer channels from each other, comprising:

first metal wires formed in said charge transfer channels on said transfer electrodes and second metal wires formed on said isolation for electrically separating said photosensing elements from each other, each of said second metal wires intersecting with and electrically separated from each of said first metal wires through an insulation layer, wherein one end of each of said transfer electrodes is formed on one of said charge transfer channels, and the other end is formed on one of said isolations for electrically separating said photosensing elements from each other, said other end formed on each of said isolations being connected through a contact to one of said first or second metal wires, and wherein said clock signals are applied to said transfer electrodes through said first and second metal wires and said contacts.

5. A solid-state image pickup device as claimed in claim 4, wherein respective two first metal wires of said first metal wires are paired and extended on each of said charge transfer channels, two clock signals of four clock signals actuated by a four-phase driving system being applied to said respective two first metal wires and the other two clock signals being applied to said second metal wires.

6. A solid-state imagepickup device as claimed in claim 4, wherein respective four first metal wires on said first metal wires are grouped and extended on said charge transfer channels, said clock signals actuated by means of a four-phase driving system being applied to said respective four first metal wires, and wherein said first metal wires are connected through said second metal wires to said transfer electrodes.

* * * * *